United States Patent
Juso et al.

(10) Patent No.: US 9,054,254 B2
(45) Date of Patent: Jun. 9, 2015

(54) SOLAR CELL AND METHOD OF MANUFACTURING SOLAR CELL

(75) Inventors: Hiroyuki Juso, Osaka (JP); Tatsuya Takamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 662 days.

(21) Appl. No.: 12/918,621

(22) PCT Filed: Feb. 16, 2009

(86) PCT No.: PCT/JP2009/052562
§ 371 (c)(1),
(2), (4) Date: Aug. 20, 2010

(87) PCT Pub. No.: WO2009/104561
PCT Pub. Date: Aug. 27, 2009

(65) Prior Publication Data
US 2010/0326518 A1    Dec. 30, 2010

(30) Foreign Application Priority Data
Feb. 21, 2008   (JP) ................. 2008-039998

(51) Int. Cl.
*H01L 31/0224*    (2006.01)
*H01L 31/0468*    (2014.01)
*H01L 31/0687*    (2012.01)

(52) U.S. Cl.
CPC .... *H01L 31/0687* (2013.01); *H01L 31/022425* (2013.01); *Y02E 10/544* (2013.01)

(58) Field of Classification Search
CPC ............ H01L 31/1892; H01L 31/1896; H01L 31/022458; H01L 27/1425; H01L 27/1426; H01L 27/1427

USPC ......... 136/249, 256, 261, 262; 257/E31.019, 257/E31.124; 438/94, 98
See application file for complete search history.

(56) References Cited

U.S. PATENT DOCUMENTS

| | | | |
|---|---|---|---|
| 3,903,427 A * | 9/1975 | Pack ............................. | 136/256 |
| 4,609,770 A * | 9/1986 | Nishiura et al. .............. | 136/244 |
| 5,176,758 A * | 1/1993 | Nath et al. .................... | 136/251 |
| 5,421,908 A | 6/1995 | Yoshida et al. | |

(Continued)

FOREIGN PATENT DOCUMENTS

| | | |
|---|---|---|
| DE | 199 36 941 | 5/2000 |
| JP | 4-333288 | 11/1992 |

(Continued)

*Primary Examiner* — Jonathan Johnson
*Assistant Examiner* — Andrew Golden
(74) *Attorney, Agent, or Firm* — Nixon & Vanderhye, P.C.

(57) ABSTRACT

A solar cell includes a rear surface electrode layer a semiconductor layer formed on a surface of rear surface electrode layer a front surface electrode layer formed on a surface of semiconductor layer and a support layer on a surface of rear surface electrode layer at a side opposite the side where semiconductor layer is formed. Semiconductor layer includes at least one p-n junction. A plurality of through holes are provided, which through holes are cavities connecting support layer openings provided on a surface of support layer at a side opposite the side where rear surface electrode layer is formed with semiconductor layer openings provided on a surface of semiconductor layer at a side opposite the side where rear surface electrode layer is formed. Front surface electrode layer is formed in a region where semiconductor layer openings are not provided. A method of manufacturing the solar cell is also disclosed.

25 Claims, 9 Drawing Sheets

(56) References Cited

U.S. PATENT DOCUMENTS

| | | | |
|---|---|---|---|
| 5,468,988 A * | 11/1995 | Glatfelter et al. | 136/256 |
| 5,626,686 A * | 5/1997 | Yoshida | 136/244 |
| 5,665,607 A | 9/1997 | Kawama et al. | |
| 5,735,966 A * | 4/1998 | Luch | 136/244 |
| 6,555,443 B1 | 4/2003 | Artmann et al. | |
| 2004/0206389 A1* | 10/2004 | Takamoto et al. | 136/255 |

FOREIGN PATENT DOCUMENTS

| | | |
|---|---|---|
| JP | 6-342924 | 12/1994 |
| JP | 7-226528 | 8/1995 |
| JP | 10-308520 | 11/1998 |
| JP | 11-330511 | 11/1999 |
| JP | 2004-319934 | 11/2004 |
| WO | 98/32164 | 7/1998 |

\* cited by examiner

US 9,054,254 B2

SOLAR CELL AND METHOD OF MANUFACTURING SOLAR CELL

This application is the U.S. national phase of International Application No. PCT/JP20091052562, filed 16 Feb. 2009, which designated the U.S. and claims priority to Japanese Application No. 2008-039998, filed 21 Feb. 2008, the entire contents of each of which are hereby incorporated by reference.

TECHNICAL FIELD

The present invention relates to solar cells and methods of manufacturing solar cells, and more particularly, to solar cells and methods of manufacturing the solar cells that are capable of, by separation of semiconductor substrates therefrom, achieving weight reduction and providing improved production efficiency.

BACKGROUND ART

Compound semiconductor solar cells including semiconductor layers, e.g., III-V compound semiconductor layers, are conventionally used as power sources in the outer space for their having high photoelectric conversion efficiency. The compound semiconductor solar cells to be used in the outer space are required to have high photoelectric conversion efficiency and light weight, as well as to be capable of being manufactured at low cost, in order to reduce costs such as expense for rocket launches.

For reducing the weight of a compound semiconductor solar cell that is fabricated by epitaxially growing a semiconductor layer, such as a III-V compound semiconductor layer, on a semiconductor substrate, a method has been proposed by which etching is performed on the semiconductor layer to separate the semiconductor layer from the semiconductor substrate, thereby achieving weight reduction. According to this method, repetitive application of the separated semiconductor substrate to the epitaxial growing process allows for cost-cut for the compound semiconductor solar cells as well.

For example, Japanese Patent Laying-Open No. 2004-319934 (Patent Document 1) discloses a method wherein a semiconductor layer is epitaxially grown on a semiconductor substrate with an etching layer interposed therebetween, and then tensile stress is applied to the semiconductor layer with an etching mask and a supporting substrate bonded to the semiconductor layer, so as to separate the semiconductor layer from the semiconductor substrate.

In addition, Japanese Patent Laying-Open No. 07-226528 (Patent Document 2) discloses a method wherein a silicon semiconductor layer formed on a substrate is etched through through holes, so as to separate the substrate from the semiconductor layer.

Patent Document 1: Japanese Patent Laying-Open No. 2004-319934
Patent Document 2: Japanese Patent Laying-Open No. 07-226528

DISCLOSURE OF THE INVENTION

Problems to be Solved by the Invention

According to the conventional method described in the above-mentioned Japanese Patent Laying-Open No. 2004-319934 (Patent Document 1), the semiconductor layer to be separated from the semiconductor substrate inevitably has a large area as the area of the semiconductor substrate becomes larger, prolonging the time taken for etching, which lowers the production efficiency of solar cells.

According to the conventional method described in Japanese Patent Laying-Open No. 07-226528 (Patent Document 2), a method is disclosed such that the semiconductor layer is peeled off from the substrate, whereon the semiconductor layer is supported with the substrate by any method so as to fluidize the subsequent steps. The semiconductor layer peeled off however has as small a thickness as on the order of 30 μm in case of a silicon semiconductor layer and on the order of several μm to 20 μm in case of a compound semiconductor layer; in addition, the compound semiconductor is very fragile. Owing to these reasons, the handling of the semiconductor layer peeled off is very difficult, which significantly compromises the production efficiency of solar cells.

In view of the above circumstances, an object of the present invention is to provide solar cells and methods of manufacturing the solar cells that are capable of, by separation of semiconductor substrates therefrom, achieving weight reduction and also of providing improved production efficiency.

Means for Solving the Problems

The present invention relates to a solar cell including: a rear surface electrode layer; a semiconductor layer formed on a surface of the rear surface electrode layer; a front surface electrode layer formed on a surface of the semiconductor layer; and a support layer on a surface of the rear surface electrode layer at a side opposite the side where the semiconductor layer is formed, wherein the semiconductor layer includes at least one p-n junction, a plurality of through holes are provided, the through holes being cavities connecting support layer openings with semiconductor layer openings, the support layer openings being provided on a surface of the support layer at a side opposite the side where the rear surface electrode layer is formed, the semiconductor layer openings being provided on a surface of the semiconductor layer at a side opposite the side where the rear surface electrode layer is formed, and the front surface electrode layer is formed in a region where the semiconductor layer openings are not provided.

In the solar cell according to the present invention, the through holes preferably have inner wall surfaces covered with the support layer.

In the solar cell according to the present invention, the semiconductor layer openings preferably have a maximum diameter of 15 μm or less.

In the solar cell according to the present invention, adjacent ones of the semiconductor layer openings are preferably spaced at a minimum distance of 200 μm or less.

In the solar cell according to the present invention, the semiconductor layer preferably has a thickness of 20 μm or less.

In the solar cell according to the present invention, the semiconductor layer preferably includes at least one of a GaAs-based compound semiconductor layer and a GaP-based compound semiconductor layer.

In the solar cell according to the present invention, the total opening area of the semiconductor layer openings is preferably not more than 1% of the light receiving area in the surface of the semiconductor layer on which surface the semiconductor layer openings are provided.

In the solar cell according to the present invention, the support layer preferably comprises an organic compound.

In the solar cell according to the present invention, the organic compound is preferably polyimide.

The present invention relates to a method of manufacturing any of the solar cells described above, including: forming an etching layer on a semiconductor substrate; forming the semiconductor layer on the etching layer; forming, on the semiconductor layer, the rear surface electrode layer having first etching holes penetrating the rear surface electrode layer along a thickness thereof; forming, on the rear surface electrode layer, the support layer having second etching holes penetrating the support layer along a thickness thereof to communicate with the first etching holes; forming the through holes by performing etching on the semiconductor layer from the first etching holes and the second etching holes to expose the etching layer at a surface thereof; separating the semiconductor layer from the semiconductor substrate by performing etching on the etching layer from at least the through holes; and forming the front surface electrode layer on a surface of the semiconductor layer in a region where the semiconductor layer openings are not provided.

Further, the present invention relates to a method of manufacturing any of the solar cells described above, including: forming an etching layer on a semiconductor substrate; forming the semiconductor layer on the etching layer; forming, on the semiconductor layer, the rear surface electrode layer having first etching holes penetrating the rear surface electrode layer along a thickness thereof; performing etching on the semiconductor layer from the first etching holes to form third etching holes that penetrate the semiconductor layer along a thickness thereof from the semiconductor layer openings to communicate with the first etching holes, and exposing the etching layer at a surface thereof; forming, on the rear surface electrode layer, the support layer having second etching holes that penetrate the support layer along a thickness thereof to communicate with the first etching holes; performing etching on the etching layer at least from the through holes to separate the semiconductor layer from the semiconductor substrate; and forming the front surface electrode layer on a surface of the semiconductor layer in a region where the semiconductor layer openings are not provided.

In the method of manufacturing a solar cell according to the present invention, the semiconductor substrate may include at least one selected from the group consisting of an Si, Ge, GaAs-based compound semiconductor, and a GaP-based compound semiconductor.

In the method of manufacturing a solar cell according to the present invention, the etching layer preferably includes at least one of an AlAs-based compound semiconductor layer and a GaInP-based compound semiconductor layer.

In the method of manufacturing a solar cell according to the present invention, the first etching holes may be formed by using at least one method selected from the group consisting of liftoff method using photolithography technique, etching, and laser beam irradiation.

In the method of manufacturing a solar cell according to the present invention, the second etching holes may be formed by using at least one method selected from the group consisting of a method using photolithography technique, etching, and laser beam irradiation.

In the solar cell according to the present invention, the semiconductor layer preferably includes: a first cell having a first band gap; a second cell having a second band gap smaller than the first band gap; and a tunnel junction between the first cell and the second cell.

In the solar cell according to the present invention, the semiconductor layer preferably includes: a first cell having a first band gap; a second cell having a second band gap smaller than the first band gap; a third cell having a third band gap smaller than the second band gap; a first tunnel junction between the first cell and the second cell; and a second tunnel junction between the second cell and the third cell.

The present invention also relates to a method of manufacturing the solar cell, including: forming an etching layer on a semiconductor substrate; forming the semiconductor layer on the etching layer; forming, on the semiconductor layer, the rear surface electrode layer having first etching holes penetrating the rear surface electrode layer along a thickness thereof; forming, on the rear surface electrode layer, the support layer having second etching holes penetrating the support layer along a thickness thereof to communicate with the first etching holes; forming the through holes by performing etching on the semiconductor layer from the first etching holes and the second etching holes to expose the etching layer at a surface thereof; performing etching on the etching layer at least from the through holes to separate the semiconductor layer from the semiconductor substrate; and forming the front surface electrode layer on a surface of the semiconductor layer in a region where the semiconductor layer openings are not provided.

Further, the present invention relates to a method of manufacturing the solar cell, including: forming an etching layer on a semiconductor substrate; forming the semiconductor layer on the etching layer; forming, on the semiconductor layer, the rear surface electrode layer having first etching holes penetrating the rear surface electrode layer along a thickness thereof; forming, on the rear surface electrode layer, the support layer having second etching holes penetrating the support layer along a thickness thereof to communicate with the first etching holes; forming the through holes by performing etching on the semiconductor layer from the first etching holes and the second etching holes to expose the etching layer at a surface thereof; performing etching on the etching layer at least from the through holes to separate the semiconductor layer from the semiconductor substrate; and forming the front surface electrode layer on a surface of the semiconductor layer in a region where the semiconductor layer openings are not provided.

The GaAs-based compound semiconductor herein refers to compound semiconductors mainly containing GaAs (gallium arsenide). The GaP-based compound semiconductor herein refers to compound semiconductors mainly containing GaP (gallium phosphide).

The AlAs-based compound semiconductor layer herein refers to compound semiconductor layers mainly containing AlAs (aluminum arsenide), The GaInP-based compound semiconductor layer herein refers to compound semiconductor layers mainly containing GaInP (gallium indium phosphide).

In the present specification, it should be so appreciated that a "main content" be contained by not less than 50% by mass.

Effects of the Invention

The present invention provides solar cells and methods of manufacturing the solar cells that are capable of, by separation of semiconductor substrates therefrom, achieving weight reduction and also of providing improved production efficiency.

DESCRIPTION OF THE REFERENCE SIGNS

Figure 1:
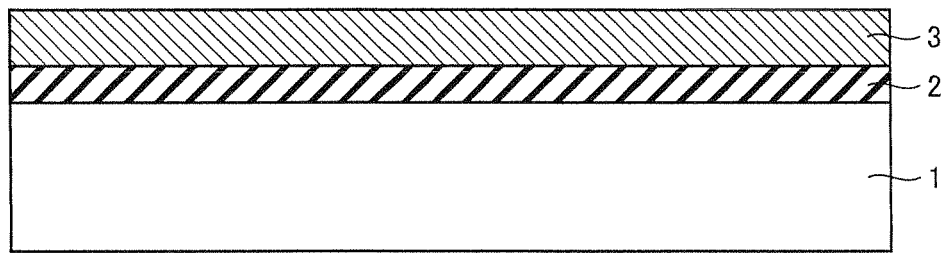
FIG. 1 is a schematic cross-sectional view illustrating a portion of a manufacturing step of a method of manufacturing a solar cell according to a first exemplary embodiment of the present invention.

1: semiconductor substrate; 2: etching layer; 3: semiconductor layer; 4: resist; 5: rear surface electrode layer; 6: first etching hole; 6a: rear surface electrode layer opening; 6b: semiconductor layer opening; 6c: support layer opening; 7: front surface electrode layer; 8: organic compound layer; 16: through hole; 26: second etching hole; 31: p-type AlGaAs layer; 32: n-type InGaP layer; 33: p-type GaAs layer; 34: n-type GaAs layer; 36: third etching hole; B1: n-type AlInP layer; B2: n-type GaAs layer; B3: p-type GaAs layer; B4: p-type InGaP layer; p-type GaAs layer; B6: n-type InP layer; B7: n-type InGaAs layer; B8: p-type InGaAs layer; B9: p-type InP layer; B10: p-type GaAs layer; M1:n-type AlInP layer; M2: n-type GaAs layer; M3: p-type GaAs layer; M4: p-type InGaP layer; T1: n-type GaAs layer; T2: n-type AlInP layer; T3: n-type InGaP layer; T4: p-type InGaP layer; T5: p-type AlInP layer; B: bottom cell; M: middle cell; T: top cell.

BEST MODES FOR CARRYING OUT THE INVENTION

Embodiments of the present invention are described below. In the drawings of the present invention, like reference numerals denote like parts or corresponding parts.

First Embodiment 1-1. Step of Forming Semiconductor Layer on Semiconductor Substrate with Etching Layer Interposed in Between First, as shown in the schematic cross-sectional view of FIG. 1, an etching layer 2 is formed on a semiconductor substrate 1, and then a semiconductor layer 3 is formed on etching layer 2.

Semiconductor substrate 1 may be a semiconductor substrate containing at least one selected from the group consisting of an Si (silicon), Ge (germanium), GaAs-based compound semiconductor, and a GaP-based compound semiconductor. In particular, a semiconductor monocrystalline substrate is preferably used for semiconductor substrate 1. This is because, in case of using a semiconductor monocrystalline substrate for semiconductor substrate 1, etching layer 2 is easily formed on a surface of semiconductor substrate 1 by means of epitaxial growing.

Next, etching layer 2 and semiconductor layer 3 are preferably grown on a surface of semiconductor substrate 1 by means of epitaxial growing. Methods of epitaxially growing etching layer 2 and semiconductor layer 3 include MOCVD (Metal Organic Chemical Vapor Deposition) method.

Etching layer 2 has only to be a layer that will be removed in a later step for lifting off semiconductor layer 3 formed on the surface of etching layer 2. Etching layer 2 preferably includes at least one of an AlAs-based compound semiconductor layer and a GaInP-based compound semiconductor layer. This is because, in case of using an AlAs-based compound semiconductor layer for etching layer 2, etching layer 2 can be selectively removed by, e.g., hydrofluoric acid etchant. Further, this is because, in case of using a GaInP-based compound semiconductor layer for etching layer 2, the restriction for the film thickness of etching layer 2 is lifted, so that etching layer 2 can be thickened, enabling high speed etching of etching layer 2 and liftoff of semiconductor layer 3. Etching layer 2 may either comprise a single layer or multiple layers.

Semiconductor layer 3 may be a compound semiconductor layer including, e.g., at least one of a GaAs-based compound semiconductor layer and a GaP-based compound semiconductor layer. Semiconductor layer 3 may either comprise a single layer or multiple layers. Semiconductor layer 3 is preferably formed such that the surface contacting etching layer 2 will serve as the light receiving surface of a solar cell.

The GaAs-based compound semiconductor layer may be one including a laminate of an n-type GaAs-based compound semiconductor layer and a p-type GaAs-based compound semiconductor layer. The GaP-based compound semiconductor layer may be one including a laminate of, e.g., an n-type GaP-based compound semiconductor layer and a p-type GaP-based compound semiconductor layer. Any semiconductor layer 3 may be used without particular limitation insofar as it includes at least one p-n junction.

In case, e.g., of using an n-type GaAs substrate ($1 \times 10^{18}$ cm$^{-3}$; Si-doped, 50 mm in diameter), which is an exemplary GaAs-based compound semiconductor substrate, for semiconductor substrate 1 and using a GaInP-based compound semiconductor layer (an n-type InGaP layer in this example) for etching layer 2, semiconductor layer 3 may be formed, e.g., as shown in the schematic cross-sectional view of FIG. 21.

First, an etching layer 2 of an about 0.5 μm-thick n-type InGaP layer is epitaxially grown on a semiconductor substrate 1 of an n-type GaAs substrate by means of, e.g., MOCVD method.

Next, an n-type GaAs layer T1, an n-type AlInP layer T2, an n-type InGaP layer T3, a p-type InGaP layer T4, and a p-type AlInP layer T5 are sequentially grown epitaxially on etching layer 2 by means of, e.g., MOCVD method to form a top cell T.

Then, a p-type AlGaAs layer 31 and an n-type InGaP layer 32 are sequentially grown epitaxially on p-type AlInP layer T5 by means of, e.g., MOCVD method to form a tunnel junction.

Next, an n-type AlInP layer B1, an n-type GaAs layer B2, a p-type GaAs layer B3, a p-type InGaP layer B4, and a p-type GaAs layer B5 are sequentially grown epitaxially on n-type InGaP layer 32 by means of, e.g., MOCVD method to form a bottom cell B.

This enables formation of an exemplary semiconductor layer 3 having a structure with the surface in contact with etching layer 2 to serve as the light receiving surface of a solar cell.

Figure 22:
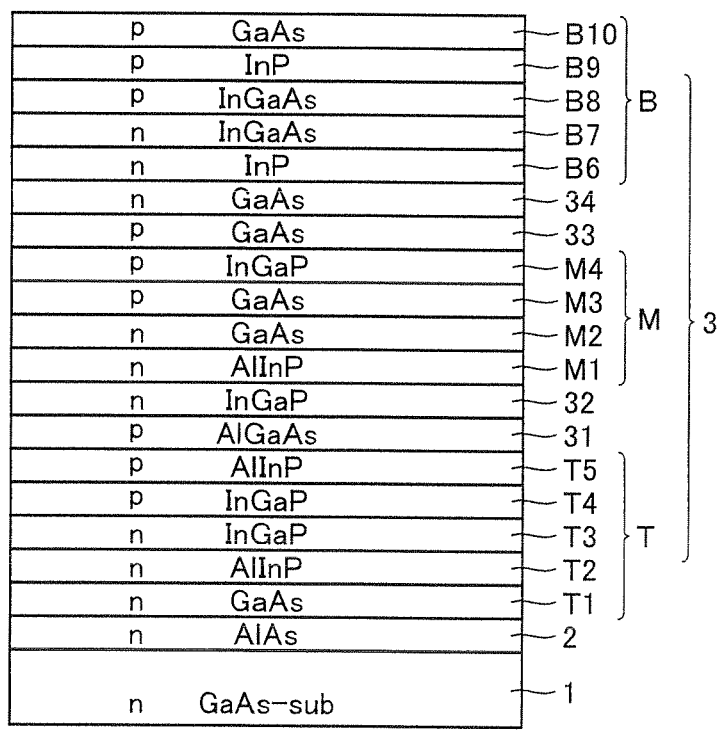
FIG. 22 is a schematic cross-sectional view illustrating another exemplary method of forming a semiconductor layer used for the present invention.

In case of using an n-type GaAs substrate ($1 \times 10^{18}$ cm$^{-3}$, Si-doped, 50 mm in diameter), which is an exemplary GaAs-based compound semiconductor substrate, for semiconductor substrate 1 and using an AlAs-based compound semiconductor layer (an n-type AlAs layer in this example) for etching layer 2, semiconductor layer 3 may be formed also as shown in, e.g., the schematic cross-sectional view of FIG. 22.

First, an etching layer 2 of an about 0.5 μm-thick n-type InGaP layer is epitaxially grown on a semiconductor substrate 1 of an n-type GaAs substrate by means of, e.g., MOCVD method.

Next, an n-type GaAs layer T1, an n-type AlInP layer T2, an n-type InGaP layer T3, a p-type InGaP layer T4, and a p-type AlInP layer T5 are sequentially grown epitaxially on etching layer 2 by means of, e.g., MOCVD method to form a top cell T.

Then, a p-type AlGaAs layer 31 and an n-type InGaP layer 32 are sequentially grown epitaxially on p-type AlInP layer T5 by means of, e.g., MOCVD method to form a tunnel junction.

Next, e.g., an n-type AlInP layer M1, an n-type GaAs layer M2, a p-type GaAs layer M3, and a p-type InGaP layer M4 are sequentially grown epitaxially on n-type InGaP layer 32 to form a middle cell M.

Thereafter, a p-type GaAs layer 33 and an n-type GaAs layer 34 are sequentially grown epitaxially on p-type InGaP layer M4 by means of, e.g., MOCVD method to form a tunnel junction.

Then, an n-type InP layer B6, an n-type InGaAs layer B7, a p-type InGaAs layer B8, a p-type InP layer B9, and a p-type GaAs layer B10 are sequentially grown epitaxially on n-type GaAs layer 34 by means of, e.g., MOCVD method to form a bottom cell B.

This enables formation of an exemplary semiconductor layer 3 having a structure with the surface in contact with etching layer 2 to serve as the light receiving surface of a solar cell.

The growing temperature for the epitaxial growing may be, e.g., a temperature around 700° C. Materials for growing a GaAs layer may include, e.g., TMG (trimethyl gallium) and AsH$_3$ (arsine).

Materials for growing an InGaP layer may include, e.g., TMI (trimethyl indium), TMG, and PH$_3$ (phosphine). Materials for growing an AlInP layer may include, e.g., TMA (trimethyl aluminum), TMI, and PH$_3$.

Further, materials of n-type impurities for forming an n-type GaAs layer, an n-type InGaP layer, and an n-type AlInP layer may include, e.g., SiH$_4$ (monosilane). Materials of p-type impurities for forming a p-type GaAs layer, a p-type InGaP layer, and a p-type AlInP layer may include, e.g., DEZn (diethyl zinc).

Materials for growing an AlGaAs layer may include, e.g., TMI, TMG, and AsH$_3$, and p-type impurities for forming a p-type AlGaAs layer may include, e.g., CBr$_4$ (carbon tetrabromide).

1-2. Step of Forming Rear Surface Electrode Layer on Semiconductor Layer

Figure 2:
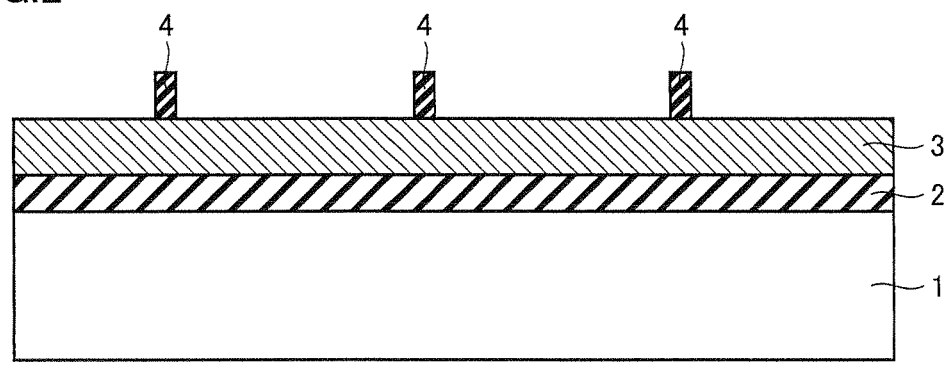
FIG. 2 is a schematic cross-sectional view illustrating another portion of a manufacturing step of the method of manufacturing a solar cell according to the first exemplary embodiment of the present invention.

Next, as shown in the schematic cross-sectional view of FIG. 2, resists 4 having a pattern in a predetermined shape are formed on a surface of semiconductor layer 3. Resists 4 are patterned to be formed at locations where first etching holes to be described later are to be formed through a method using, e.g., photolithography technique. Resists 4 may also be patterned so as to form the outer shape of the first etching holes and of a solar cell to be described later. Conventionally known resists may be used for resists 4 without particular limitation, and for example, a photosensitive organic compound film may be used.

Figure 3:
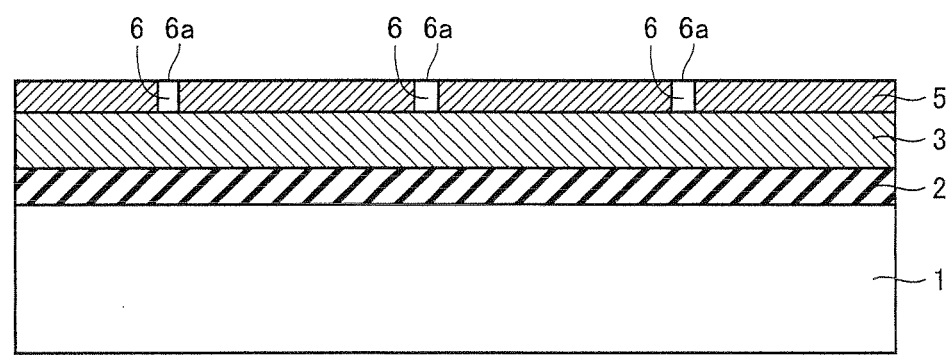
FIG. 3 is a schematic cross-sectional view illustrating another portion of a manufacturing step of the method of manufacturing a solar cell according to the first exemplary embodiment of the present invention.

Then, as shown in the schematic cross-sectional view of FIG. 3, a rear surface electrode layer 5 may be formed on a surface of semiconductor layer 3 having resists 4 formed thereon. Thereafter, resists 4 are removed by liftoff, thereby forming first etching holes 6, which are cavities within rear surface electrode layer 5.

Any electrode may be used for rear surface electrode layer 5 without particular limitation, insofar as the electrode is made from a conductive material such as gold or silver. The outer shape of rear surface electrode layer 5 may form the outer shape of the final shape of a solar cell to be formed at last. The openings provided at the surface of first etching holes 6 that are formed in rear surface electrode layer 5, which surface is on the side of rear surface electrode layer 5, correspond to rear surface electrode layer openings 6a.

The method of forming first etching holes 6 is not particularly limited, and it is possible to use, as described above, a method wherein resists 4 having a pattern in a predetermined shape are formed on a surface of semiconductor layer 3 by means of photolithography technique and are then lifted off for removal. Methods of forming first etching holes 6 include a method wherein photolithography technique is used to form resists having a pattern in a predetermined shape on a surface of rear surface electrode 5 and then to etch and remove the portions of rear surface electrode layer 5 that are not protected by the resists; this method may be used alone or in combination with any other method. Methods of forming first etching holes 6 may include a method wherein the surface of rear surface electrode layer 5 is irradiated with laser beams to remove the irradiated portion such that first etching holes 6 are formed; this method may also be used alone or in combination with any other method.

1-3. Step of Forming Support Layer on Rear Surface Electrode Layer

Figure 4:
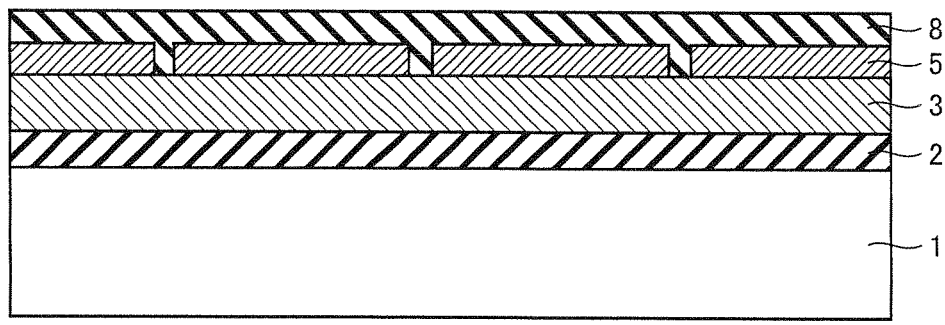
FIG. 4 is a schematic cross-sectional view illustrating another portion of a manufacturing step of the method of manufacturing a solar cell according to the first exemplary embodiment of the present invention.
Figure 5:
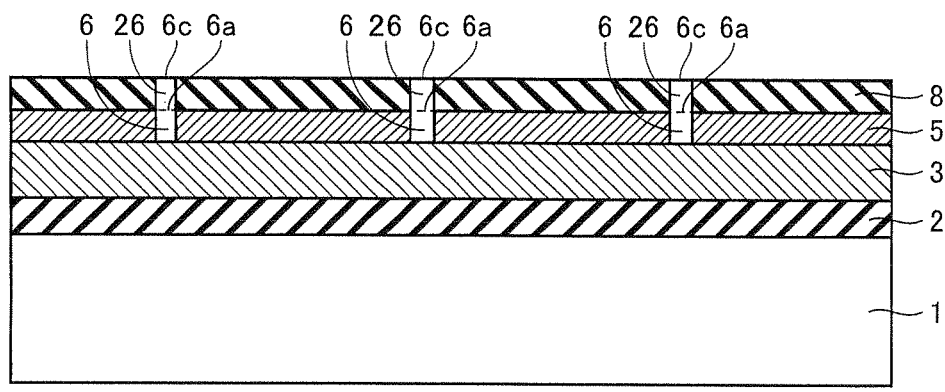
FIG. 5 is a schematic cross-sectional view illustrating another portion of a manufacturing step of the method of manufacturing a solar cell according to the first exemplary embodiment of the present invention.

Next, as shown in the schematic cross-sectional view of FIG. 4, a support layer 8 is formed on rear surface electrode layer 5. It should be noted that support layer 8 is formed to cover the surface of rear surface electrode layer 5, filling up first etching holes 6 shown in FIG. 3. Then, as shown in the schematic cross-sectional view of FIG. 5, portions of support layer 8 are removed for support layer 8 not to remain in first etching holes 6, thus forming second etching holes 26 providing cavities within support layer 8, while support layer openings 6c of second etching holes 26 are provided at the surface of support layer 8, which surface is not at the side of rear surface electrode layer 5. A second etching hole 26 formed in support layer 8 and a first etching hole 6 formed in rear surface electrode layer 5 jointly form one cavity with at least portions of the respective openings at their ends overlapping each other.

By way of thus forming support layer 8 on rear surface electrode layer 5, even in case of forming semiconductor layer 3 into a thin film of not more than 20 μm thick, the handling performance of the thin film of semiconductor layer 3 is improved by the presence of support layer 8, providing improved production efficiency of solar cells of the present invention.

Support layer 8 is preferably formed from an organic compound. In case of forming support layer 8 from an organic compound, further weight reduction is achieved with the solar cell of the present invention. Polyimide is preferably used as an organic compound to form support layer 8 in view of further weight reduction of the solar cell of the present invention and also in view of increasing heat resistance of support layer 8. Polyimide generally refers to high-molecular compounds containing imide bonds as a repeating unit, and, e.g., an aromatic polyimide comprising an aromatic compound directly bonded thereto with an imide bond may be used as the polyimide.

The method of forming second etching holes 26 is also not particularly limited, and it is possible to use, for example, a method wherein resists of e.g., a photosensitive organic compound film are used on support layer 8 so as to remove portions of support layer 8 by means of photolithography technique (for example, a method wherein first etching holes 6 are formed by removing only some of the exposed portions of support layer 8). Methods of forming second etching holes 26 may include a method wherein resists having a pattern in a predetermined shape are formed on a surface of support layer 8, e.g., by means of photolithography technique and then the portions of support layer 8 that are not protected by the resists are removed by etching; this method may be used alone or in combination with any other method. Methods of forming second etching holes 26 may include, e.g., a method wherein a surface of support layer 8 is irradiated with laser beams to remove the irradiated portions, thereby forming second etching holes 26; this method may also be used alone or in combination with any other method. As described above, any conventionally known resists may be used as the resists without particular limitations, and, e.g., a photosensitive organic compound film may be used.

Support layer openings 6c are preferably smaller in opening area than rear surface electrode layer openings 6a. In this case, a tendency is seen that the contact of etchant to rear surface electrode layer 5 is avoided during etching of semiconductor layer 3 to be described later, so that the surface of rear surface electrode layer 5 is protected from the etchant.

1-4. Step of Etching Semiconductor Layer

Figure 6:
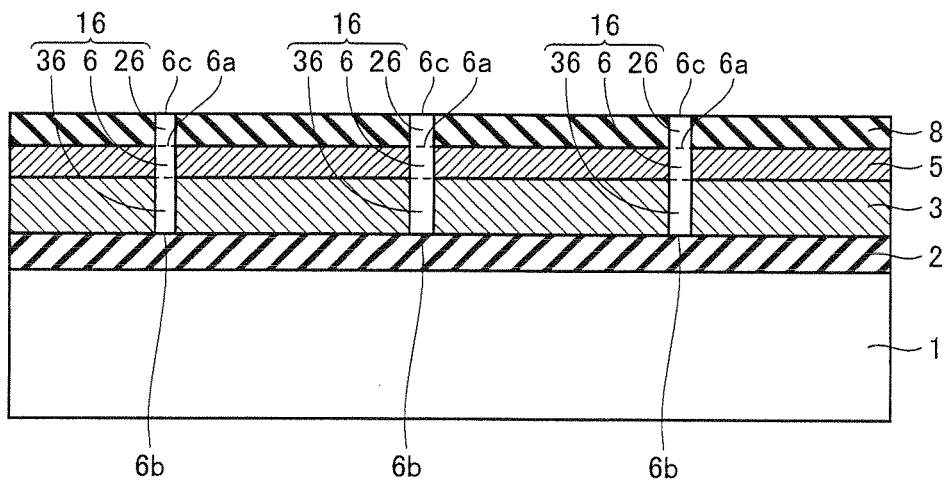
FIG. 6 is a schematic cross-sectional view illustrating another portion of a manufacturing step of the method of manufacturing a solar cell according to the first exemplary embodiment of the present invention.

Next, as shown in the schematic cross-sectional view of FIG. 6, portions of semiconductor layer 3 are removed by etching along the thickness thereof from the cavities provided in the form of continuity of first etching holes 6 and second etching holes 26. Third etching holes 36, which are cavities with the outer peripheries defined by semiconductor layer 3, are thereby formed, and etching layer 2 is exposed at the surface. A third etching hole 36 and a first etching hole 6 jointly form one cavity with at least portions of the respective openings at their ends overlapping each other. Third etching holes 36 are formed by removing portions of semiconductor layer 3 through, e.g., wet etching using etchant.

Thus, semiconductor layer openings 6b are provided at the surface of semiconductor layer 3 at the side of etching layer 2, while through holes 16, which are cavities constituted by the cavities formed in semiconductor layer 3 by the etching, first etching holes 6, second etching holes 26, and third etching holes 36, are formed. Through holes 16 are formed at a plurality of locations.

Adjacent semiconductor layer openings 6b are preferably spaced at a minimum distance of 200 μm or less, and more preferably, 150 μm or less. Where adjacent semiconductor layer openings 6b are spaced at a minimum distance of 200 μm or less, and particularly, 150 μm or less, a tendency is seen that semiconductor layer openings 6b are capable of being disposed at desired locations and in a desired shape.

According to the present invention, the minimum distance between adjacent semiconductor layer openings 6b means the length of the shortest line segment of line segments linking a point on the peripheral edge of one of two adjacent semiconductor layer openings 6b to a point on the peripheral edge of the other of the two semiconductor layer openings 6b.

According to the present invention, although at least one of the minimum distances between adjacent semiconductor layer openings 6b may be the preferred value of 200 μm or less, or the more preferred value of 150 μm or less, the minimum distance between every adjacent semiconductor layer openings 6b is preferably 200 μm or less, and more preferably, 150 μm or less.

Further, the maximum diameter of semiconductor layer openings 6b is preferably 15 μm or less. More specifically, in the present embodiment, the surface of semiconductor layer 3 at the side where semiconductor layer openings 6b are provided will serve as the light receiving surface of a solar cell; for this reason, the larger the maximum diameter of semiconductor layer openings 6b, the smaller the area of the light receiving surface of the solar cell is, which invites degradation in the efficiency of photoelectric conversion.

According to the present invention, the maximum diameter of semiconductor layer openings 6b means the length of the longest line segment of line segments linking any two points present on the peripheral edge of a semiconductor layer opening 6b. According to the present invention, the light receiving surface means, assuming that a solar cell is installed, a surface of the surfaces of the solar cell that mainly introduces solar light therethrough.

In case where the surface of semiconductor layer 3 at the side where semiconductor layer openings 6b are provided will serve as the light receiving surface of a solar cell as in the present embodiment, the total opening area of semiconductor layer openings 6b is preferably 1% or less of the light receiving area in the surface of semiconductor layer 3 on which surface semiconductor layer openings 6b are provided. Where the total opening area of semiconductor layer openings 6b is 1% or less of the light receiving area in the surface of semiconductor layer 3 on which surface semiconductor layer openings 6b are provided, a tendency is seen such that the degradation in photoelectric conversion efficiency of the solar cells is obviated and also the time taken for etching of etching layer 2 to be described later is saved.

According to the present invention, the light receiving area of a solar cell at the surface of semiconductor layer 3 means the total area of the surface of semiconductor layer 3, which surface is provided with semiconductor layer openings 6b and will serve as the light receiving surface of the solar cell.

The opening shape of semiconductor layer openings 6b is not particularly limited and may be, e.g., a quadrangle or a triangle.

1-5. Step of Removing Etching Layer

Figure 7:
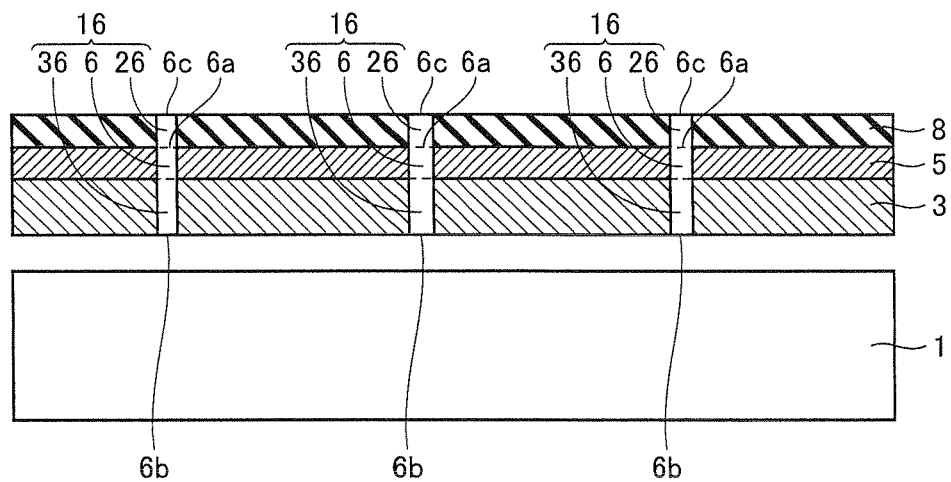
FIG. 7 is a schematic cross-sectional view illustrating another portion of a manufacturing step of the method of manufacturing a solar cell according to the first exemplary embodiment of the present invention.

Next, as shown in the schematic cross-sectional view of FIG. 7, etching is performed on etching layer 2 from within through holes 16 and from a lateral surface of etching layer 2 to remove etching layer 2. This enables semiconductor layer 3 to be separated from semiconductor substrate 1.

The etching of etching layer 2 may be performed, e.g., in such a manner that an etchant capable of selectively removing only etching layer 2 is infused from inside through holes 16 and from a lateral surface of etching layer 2.

For example, in case where etching layer 2 comprises an AlAs-based compound semiconductor layer, etching layer 2 alone can be selectively removed with an etchant of, e.g., hydrofluoric acid. That is, in case where an AlAs-based compound semiconductor layer is used as etching layer 2 and besides an etchant of, e.g., hydrofluoric acid is used, the AlAs-based compound semiconductor layer is greater in etching rate than semiconductor layer 3 of, e.g., a GaAs-based compound semiconductor layer and rear surface electrode layer 5 formed from, e.g., silver, so that etching layer 2 is selectively etched.

In case where etching layer 2 comprises a GaInP-based compound semiconductor layer, etching layer 2 alone can be selectively removed with an etchant of, e.g., hydrochloric acid. That is, in case where a GaInP-based compound semiconductor layer is used as etching layer 2 and besides an etchant of, e.g., hydrochloric acid is used, the GaInP-based compound semiconductor layer is greater in etching rate than semiconductor layer 3 comprising, e.g., a GaAs-based compound semiconductor layer and rear surface electrode layer 5 formed from, e.g., silver, so that etching layer 2 is selectively etched.

In addition, the etchant erodes etching layer 2 through the inside of through holes 16 or from a lateral surface of etching layer 2. Thus performing etching of etching layer 2 by infusing the etchant through the inside of through holes 16 allows for significant reduction in time taken for etching of etching layer 2 as compared with the conventional method of performing etching on etching layer 2 only from a lateral surface thereof.

For example, in case where an AlAs-based compound semiconductor layer is used as etching layer 2, an etchant of hydrofluoric acid is used, the diameter of circular openings of rear surface electrode layer openings 6a of through holes 16 is set to 5 μm, and the distance between adjacent rear surface electrode layer openings 6a is set to 50 μm, setting the temperature of the hydrofluoric acid to 50° C. and the concentration of hydrogen fluoride in the hydrofluoric acid to 10% by mass enables the etching of etching layer 2 to be completed within 10 minutes, so that semiconductor layer 3 can be separated from semiconductor substrate 1.

Meanwhile, according to the conventional method that does not involves the use of through holes 16, when using a 4.0 inch semiconductor substrate, the etching of etching layer 2 requires about 24 to 48 hours.

As described above, according to the present invention, weight reduction of solar cells is achieved through thinning of semiconductor layer 3 and separation of semiconductor layer 3 from semiconductor substrate 1. Moreover, even in cases where semiconductor layer 3 is provided in the form of a thin film, the handling performance of semiconductor layer 3 is improved by the presence of support layer 8, and the time taken for the etching of etching layer 2 is significantly reduced. The production efficiency of the solar cells according to the present invention is thus remarkably enhanced.

The present inventor confirms through experiments that the separation of semiconductor layers 3 from semiconductor substrates 1 can be effected within 10 minutes as described above, in case where the minimum distance between every adjacent rear surface electrode layer openings 6a of through holes 16 is 150 μm or less (namely, the minimum distance between every adjacent semiconductor layer openings 6b is 150 or less).

The locations at which through holes 16 are formed are not particularly limited unless they overlap with the location at which front surface electrode layer 7 to be described later is formed.

It should be noted that, according to the present invention, semiconductor substrate 1 eliminated with semiconductor layer 3 may undergo a proper surface treatment for reuse.

1-6. Step of Forming Front Surface Electrode Layer

Figure 8:
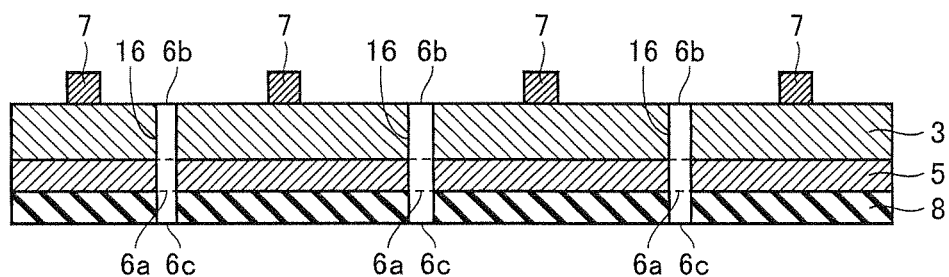
FIG. 8 is a schematic cross-sectional view illustrating another portion of a manufacturing step of the method of manufacturing a solar cell according to the first exemplary embodiment of the present invention.

Next, as shown in the schematic cross-sectional view of FIG. 8, a front surface electrode layer 7 is formed on a front surface of semiconductor layer 3 that has been separated from semiconductor substrate 1.

Front surface electrode layer 7 is formed, e.g., in the following way: Resists are formed, by means of photolithography technique, on a surface of semiconductor layer 3 at locations other than the locations at which front surface electrode layer 7 is to be formed, a conductor film of a conductive material such as gold or silver is then formed on the resists, and the resists are removed thereafter by liftoff.

In the present embodiment, as the surface of semiconductor layer 3 on which front surface electrode layer 7 is formed will serve as the light receiving surface of a solar cell, front surface electrode layer 7 preferably has such a shape that the loss of light receiving area of the solar cell is as small as possible, e.g., a comb-like shape.

1-7. Solar Cell

Figure 9:
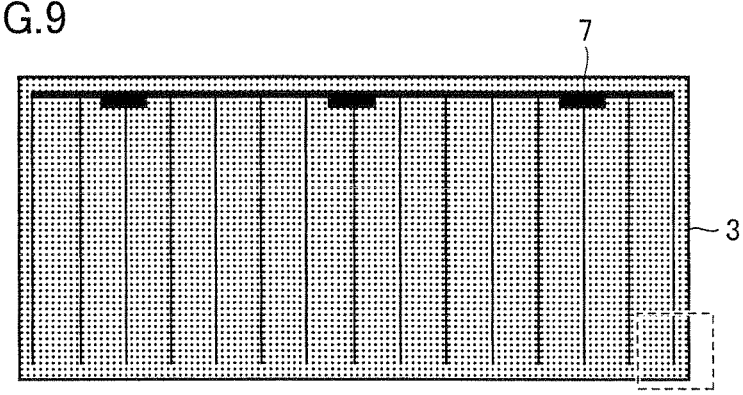
FIG. 9 is a schematic plan view of a solar cell manufactured in the first and a second exemplary embodiment of the present invention as seen from the side of a light receiving surface thereof.

FIG. 9 shows a schematic plan view of a solar cell manufactured in the first embodiment as seen from the side of the light receiving surface. As shown in FIG. 9, a surface electrode layer 7 having a pattern in a comb-like shape is formed on the surface of semiconductor layer 3.

Figure 10:
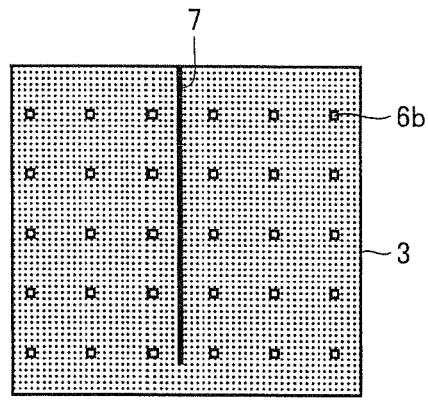
FIG. 10 is a schematic enlarged plan view of the portion enclosed with the dash line in FIG. 9.

Further, FIG. 10 shows a schematic enlarged plan view of the portion enclosed with the dash line in FIG. 9. As shown in FIG. 10, a plurality of semiconductor layer openings 6b are provided in the surface of semiconductor layer 3, and front surface electrode layer 7 is formed on the surface of semiconductor layer 3 in the region where semiconductor layer openings 6b (through holes 16) are not provided.

Figure 11:
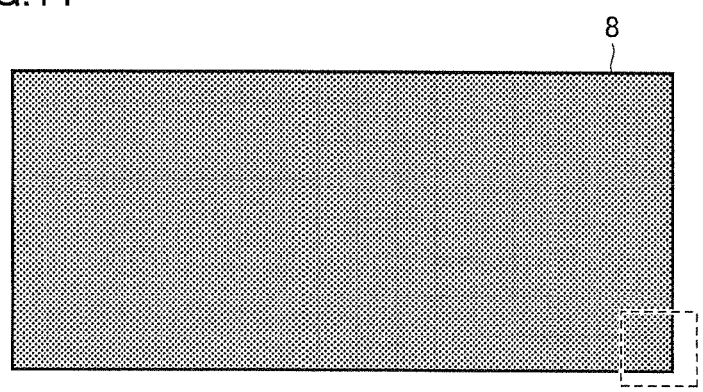
FIG. 11 is a schematic plan view of a solar cell manufactured in the first exemplary embodiment of the present invention as seen from the side of a rear surface thereof.

FIG. 11 is a schematic plan view of the solar cell manufactured in the first embodiment as seen from the side of the rear surface. As shown in FIG. 11, a support layer 8 is formed on substantially the entire area of the rear surface of the solar cell.

Figure 12:
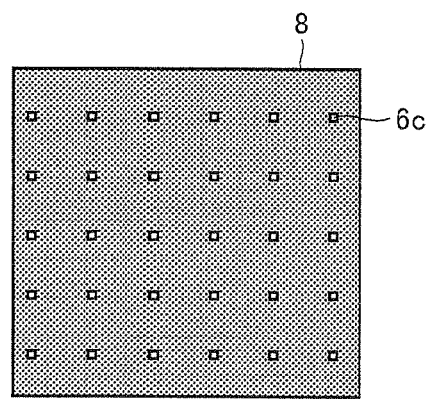
FIG. 12 is a schematic enlarged plan view of the portion enclosed with the dash line in FIG. 11.

FIG. 12 shows a schematic enlarged plan view of the portion enclosed with the dash line in FIG. 11. As shown in FIG. 12, a plurality of support layer openings 6c are provided in the surface of support layer 8.

The respective locations at which semiconductor layer openings 6b are formed and those at which support layer openings 6c are formed correspond to the locations at which through holes 16 are formed.

Figure 21:
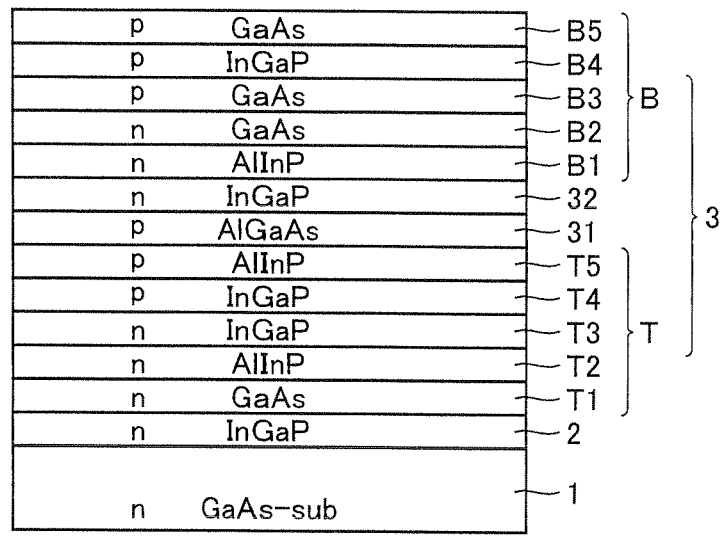
FIG. 21 is a schematic cross-sectional view illustrating an exemplary method of forming a semiconductor layer used for the present invention.
Figure 23:
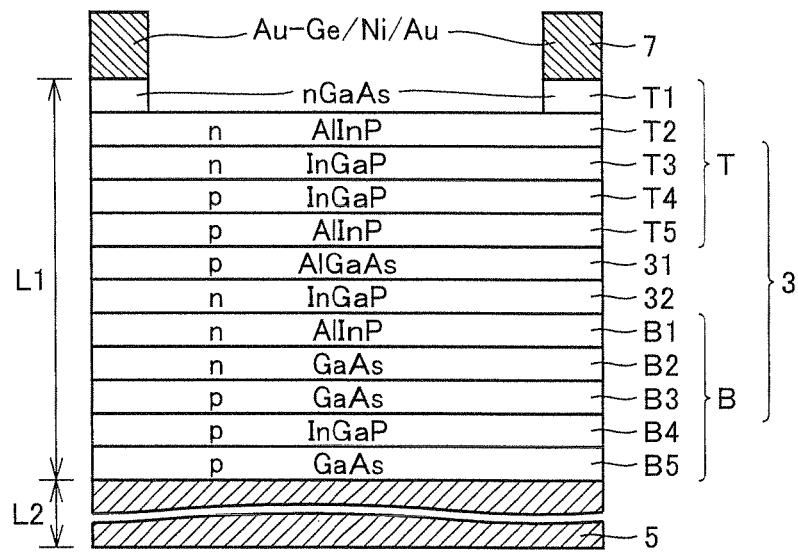
FIG. 23 is a schematic cross-sectional view of an exemplary two junction-type compound semiconductor solar cell of the present invention.

FIG. 23 shows an exemplary schematic cross-sectional view of a two junction-type compound semiconductor solar cell in which the semiconductor layer is fabricated in the manner as shown in FIG. 21. In FIG. 23, support layer 8 is not shown for the sake of convenience of description.

In the two junction-type compound semiconductor solar cell with the structure shown in FIG. 23, rear surface electrode layer 5 has formed thereon a bottom cell B comprising a p-type GaAs layer B5, p-type InGaP layer B4, p-type GaAs layer B3, n-type GaAs layer B2, and n-type AlInP layer B1 laminated in this order.

Bottom cell B has formed thereon a tunnel junction comprising an n-type InGaP layer 32 and a p-type AlGaAs layer 31 laminated in this order.

P-type AlGaAs layer 31 has formed thereon a top cell T comprising a p-type AlInP layer T5, p-type InGaP layer T4, n-type InGaP layer T3, n-type AlInP layer T2, and n-type GaAs layer T1 laminated in this order.

Top cell T has formed thereon a front surface electrode layer 7 comprising, e.g., an Au—Ge film (containing Ge by 12% by mass) of about 100 nm thick, an Ni film of about 20 nm thick, and an Au film of about 5000 nm thick laminated in this order.

The exposed surface of top cell T has formed thereon an anti-reflection film (not illustrated) comprising, e.g., a $TiO_2$ film of about 55 nm thick and an $MgF_2$ film of about 100 nm thick laminated in this order.

The band gap of n-type GaAs layer B2 and p-type GaAs layer B3 constituting the p-n junction of bottom cell B of the two junction-type compound semiconductor solar cell with the structure shown in FIG. 23 is smaller than the band gap of n-type InGaP layer T3 and p-type InGaP layer T4 constituting the p-n junction of top cell T.

Semiconductor layer 3 of the two junction-type compound semiconductor solar cell with the structure shown in FIG. 23 may have a thickness L1 on the order of about 4 µm, and rear surface electrode layer 5 may have a thickness L2 on the order of about 30 µm. Semiconductor layer 3 and rear surface electrode layer 5 have flexibility resulting from thickness L1 of semiconductor layer 3 and thickness L2 of rear surface electrode layer 5 thus set, and the two junction-type compound solar cell itself with the structure shown in FIG. 23 is hence is freely flexible.

Figure 24:
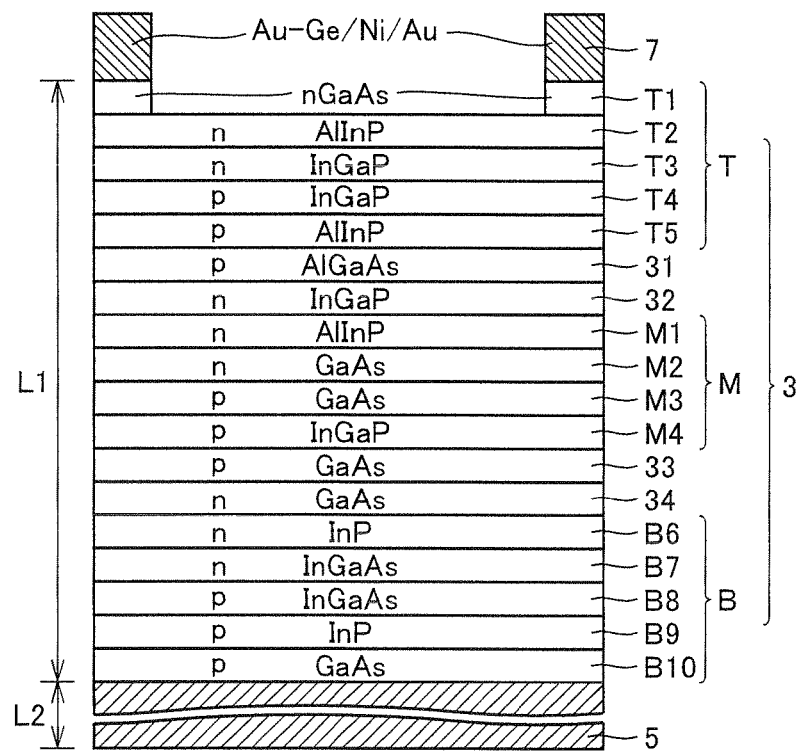
FIG. 24 is a schematic cross-sectional view of an exemplary three junction-type compound semiconductor solar cell of the present invention.

FIG. 24 shows an exemplary schematic cross-sectional view of a three junction-type compound semiconductor solar cell in which a semiconductor layer is fabricated as shown in FIG. 22. Support layer 8 is not illustrated for the sake of description also in FIG. 24.

In the three junction-type compound semiconductor solar cell with the structure shown in FIG. 24, rear surface electrode layer 5 has formed thereon a bottom cell B comprising a p-type GaAs layer B10, p-type InP layer B9, p-type InGaAs layer B8, n-type InGaAs layer B7, and n-type InP layer B6 laminated in this order.

Bottom cell B has formed thereon a tunnel junction comprising an n-type GaAs layer 34 and a p-type GaAs layer 33 laminated in this order.

Further, p-type GaAs layer 33 has formed thereon a middle cell M comprising a p-type InGaP layer M4, p-type GaAs layer M3, n-type GaAs layer M2, and n-type AlInP layer M1 laminated in this order.

Middle cell M has formed thereon a tunnel junction comprising an n-type InGaP layer 32 and a p-type AlGaAs layer 31 laminated in this order.

Further, p-type AlGaAs layer 31 has formed thereon a top cell T comprising a p-type AlInP layer T5, p-type InGaP layer T4, n-type InGaP layer T3, n-type AlInP layer T2, and n-type GaAs layer T1 laminated in this order.

Top cell T has formed thereon a front surface electrode layer 7 comprising, e.g., an Au—Ge film (containing Ge by 12% by mass) of about 100 nm thick, an Ni film of about 20 nm thick, and an Au film of about 5000 nm thick laminated in this order.

The exposed surface of top cell T has formed thereon an anti-reflection film (not illustrated) comprising, e.g., a $TiO_2$ film of about 55 nm thick and an $MgF_2$ film of about 100 nm thick laminated in this order.

The band gap of n-type GaAs layer M2 and p-type GaAs layer M3 constituting the p-n junction of middle cell M of the three junction-type compound semiconductor solar cell with the structure shown in FIG. 24 is smaller than the band gap of n-type InGaP layer T3 and p-type InGaP layer T4 constituting the p-n junction of top cell T.

In addition, the band gap of n-type InGaAs layer B7 and p-type InGaAs layer B8 constituting the p-n junction of bottom cell B of the three junction-type compound semiconductor solar cell with the structure shown in FIG. 24 is smaller than the band gap of n-type GaAs layer M2 and p-type GaAs layer M3 constituting the p-n junction of middle cell M.

Further, semiconductor layer 3 of the three junction-type compound semiconductor solar cell with the structure shown in FIG. 24 may have a thickness L1 on the order of about 4 μm, and rear surface electrode layer 5 may have a thickness L2 on the order of about 30 μm. Semiconductor layer 3 and rear surface electrode layer 5 have flexibility resulting from thickness L1 of semiconductor layer 3 and thickness L2 of rear surface electrode layer 5 thus set, so that the three junction-type compound solar cell itself with the structure shown in FIG. 24 is freely flexible.

Second Embodiment

Figure 13:
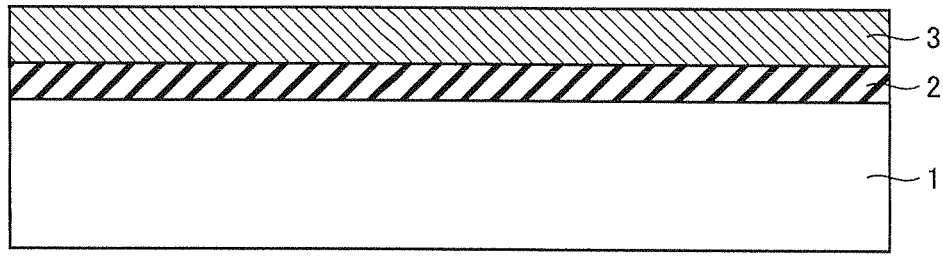
FIG. 13 is a schematic cross-sectional view illustrating a portion of a manufacturing step of a method of manufacturing a solar cell according to a second exemplary embodiment of the present invention.
Figure 14:
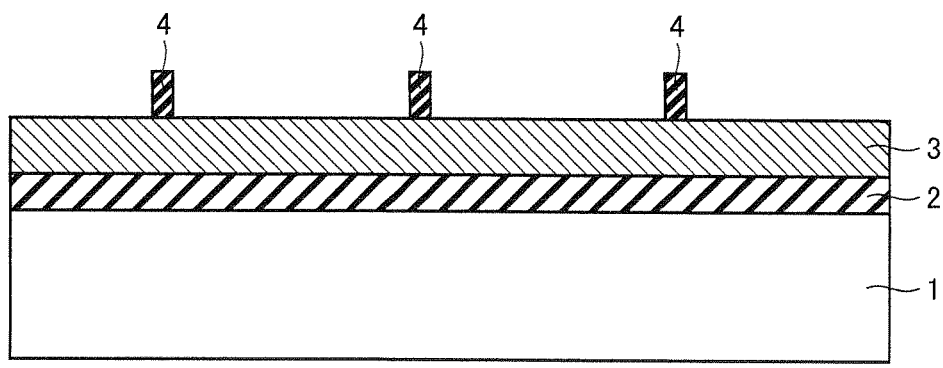
FIG. 14 is a schematic cross-sectional view illustrating a portion of a manufacturing step of the method of manufacturing a solar cell according to the second exemplary embodiment of the present invention.
Figure 15:
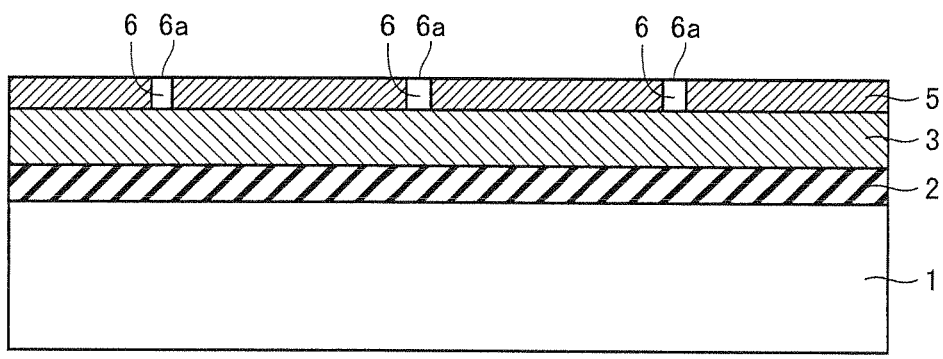
FIG. 15 is a schematic cross-sectional view illustrating another portion of a manufacturing step of the method of manufacturing a solar cell according to the second exemplary embodiment of the present invention.

As shown in the schematic cross-sectional views of FIGS. 13 to 15, an etching layer 2 is formed on a surface of a semiconductor substrate 1, a semiconductor layer 3 is formed on a surface of etching layer 2, and then a rear surface electrode layer 5 having rear surface electrode layer openings 6a and first etching holes 6 is formed. The steps so far are the same as those of the first embodiment.

Figure 16:
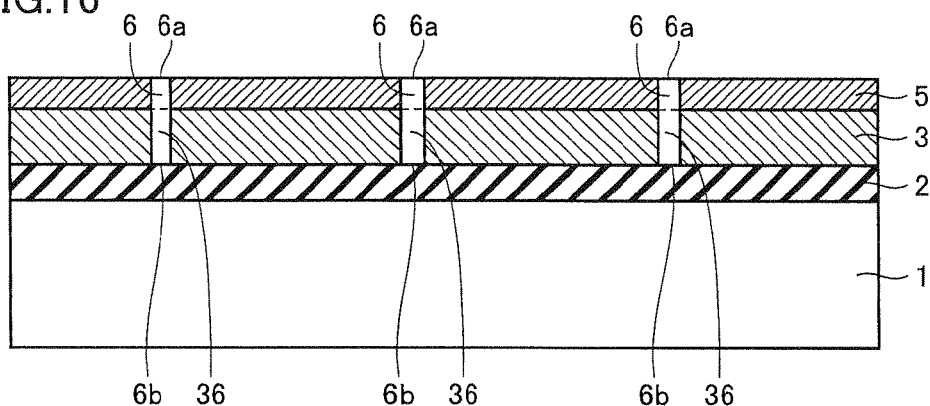
FIG. 16 is a schematic cross-sectional view illustrating another portion of a manufacturing step of the method of manufacturing a solar cell according to the second exemplary embodiment of the present invention.

Next, as shown in the schematic cross-sectional view of FIG. 16, portions of semiconductor layer 3 are removed along the thickness thereof by etching from first etching holes 6, thereby subjecting etching layer 2 to exposure at its surface. Thus, the surface of semiconductor layer 3 at the side of etching layer 2 is provided with semiconductor layer openings 6b as well as third etching holes 36 that penetrate through semiconductor layer 3 thickwise from semiconductor layer openings 6b to communicate with first etching holes 6. Third etching holes 36 may be formed by removing portions of semiconductor layer 3, e.g., by means of wet etching using an etchant.

Figure 17:
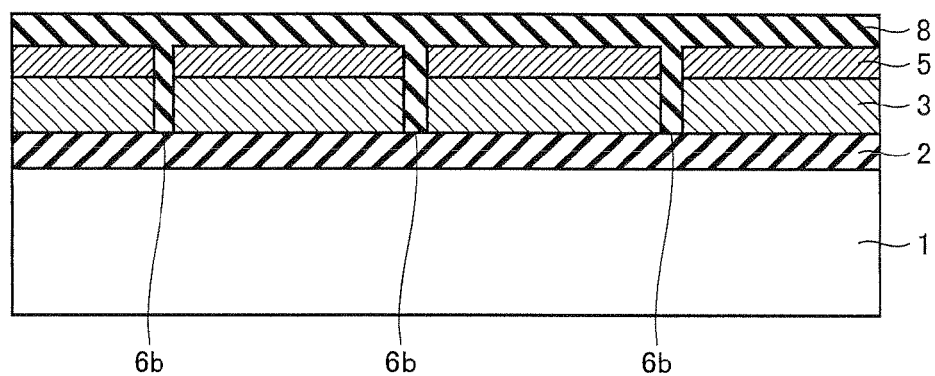
FIG. 17 is a schematic cross-sectional view illustrating another portion of a manufacturing step of the method of manufacturing a solar cell according to the second exemplary embodiment of the present invention.

Then, as shown in the schematic cross-sectional view of FIG. 17, a support layer 8 is formed on the surface of rear surface electrode layer 5, filling up first etching holes 6 and third etching holes 36. Support layer 8 is thus formed on the surface of rear surface electrode layer 5, and even in case of providing semiconductor layer 3 in the form of a thin film, the presence of support layer 8 helps improve the handling performance of a thin film of semiconductor layer 3.

Figure 18:
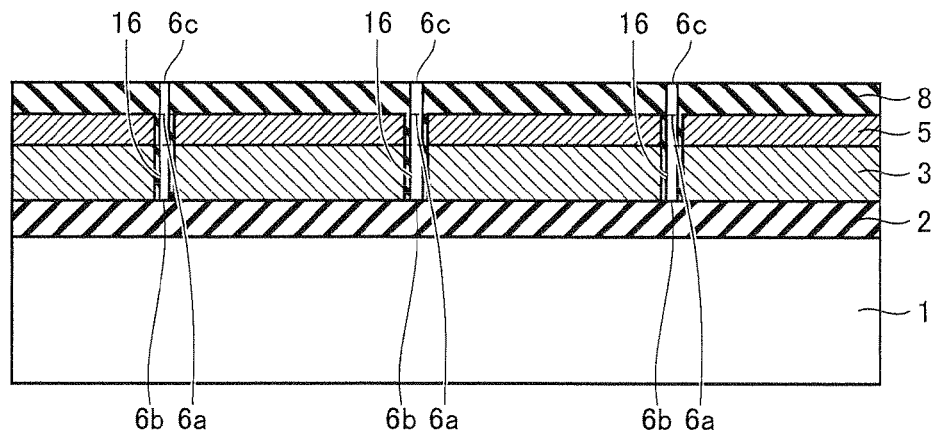
FIG. 18 is a schematic cross-sectional view illustrating another portion of a manufacturing step of the method of manufacturing a solar cell according to the second exemplary embodiment of the present invention.

Next, as shown in the schematic cross-sectional view of FIG. 18, through holes 16 are formed by removing portions of support layer 8 along the thickness thereof, such that etching layer 2 is exposed at its surface. The locations eliminated with support layer 8 correspond to the locations at which first etching holes 6 and third etching holes 36 are formed. Support layer openings 6c are provided at the surface of support layer 8, which surface is not on the side of rear surface electrode layer 5.

It should be noted here that support layer 8 is preferably removed with the inner wall surfaces of through holes 16 covered with support layer 8. In case where the inner wall surfaces of through holes 16 are covered with support layer 8, semiconductor layer 3 and rear surface electrode layer 5 are protected with support layer 8 during the step of removing etching layer 2 to be described later, which diminishes the likelihood of damage being inflicted to semiconductor layer 3 and rear surface electrode layer 5.

The method of removing support layer 8 is not particularly limited, and such methods include, e.g., a method wherein resists having a pattern in a predetermined shape are formed on a surface of support layer 8 by means of photolithography technique to then remove portions of support layer 8 that are not provided with the resists.

Another method of removing support layer 8 may be, for example, such that resists having a pattern in a predetermined shape are formed on a surface of support layer 8 by means of photolithography technique, and then the portions of support layer 8 that are not provided with the resists are removed by etching; this method may also be used alone or in combination with any other method. Another method of removing support layer 8 may be, for example, such that a surface of support layer 8 is irradiated with laser beams and the irradiated portions are removed; this method may also be used alone or in combination with any other method.

Figure 19:
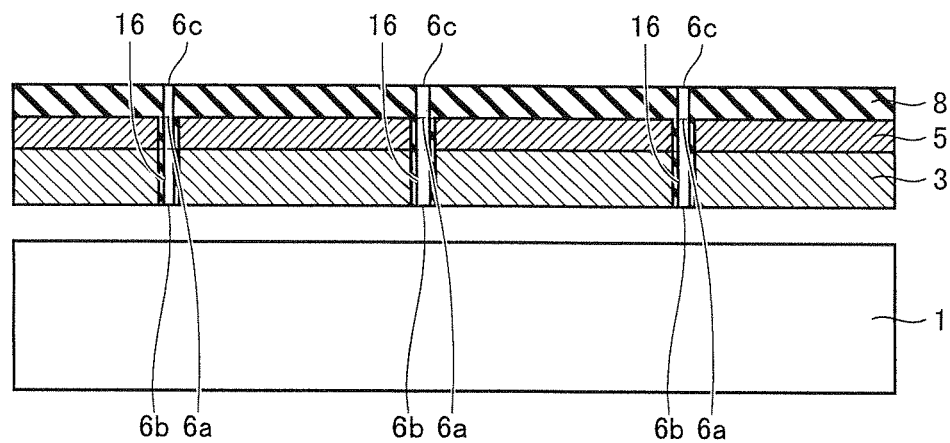
FIG. 19 is a schematic cross-sectional view illustrating another portion of a manufacturing step of the method of manufacturing a solar cell according to the second exemplary embodiment of the present invention.

Next, as shown in the schematic cross-sectional view of FIG. 19, etching is performed on etching layer 2 from within through holes 16 and from a lateral surface of etching layer 2, so as to remove etching layer 2. Thus, semiconductor layer 3 is separated from semiconductor substrate 1.

Removal of etching layer 2 by means of etching may be, for example, effected by infusing an etchant that is capable of selectively removing only etching layer 2 from within through holes 16 and from a lateral surface of etching layer 2.

Figure 20:
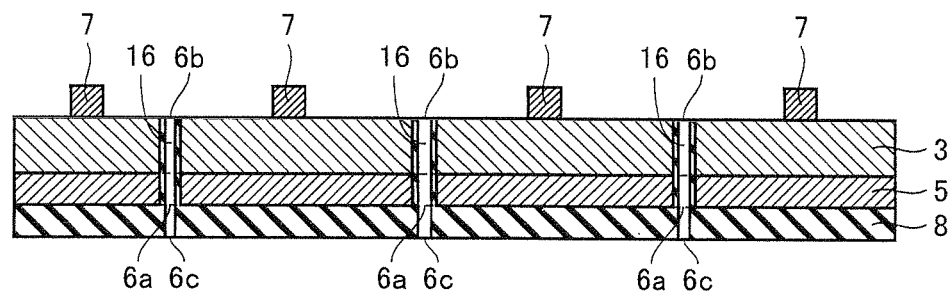
FIG. 20 is a schematic cross-sectional view illustrating another portion of a manufacturing step of the method of manufacturing a solar cell according to the second exemplary embodiment of the present invention.

Thereafter, as shown in the schematic cross-sectional view of FIG. 20, surface electrode layer 7 is formed in the region where semiconductor layer openings 6b are not provided, which completes the production of a solar cell of the second embodiment. The front and rear surface geometries of the solar cell of the second embodiment may be the same as those of the first embodiment. As described above, the locations at which support layer openings 6c are provided correspond to the locations at which through holes 16 are formed.

The same description as that of the first embodiment applies to the matters other than those described above of the second embodiment.

The embodiments disclosed herein are merely illustrative in all respects and should not be considered restrictive. The scope of the invention is defined solely by the appended claims and not by the above description and is intended to encompass all changes and modifications within the meaning of the claims and equivalents thereof.

INDUSTRIAL APPLICABILITY

According to the present invention, weight reduction is achieved with solar cells and methods of manufacturing the solar cells through separation of semiconductor substrates therefrom, thus providing improved production efficiency. The present invention may thus be suitably applied in the field of solar cells, and in particular, of compound semiconductor solar cells using compound semiconductor layers.

The invention claimed is:
1. A solar cell comprising:
a rear surface electrode layer
a semiconductor layer formed on a surface of said rear surface electrode layer
a front surface electrode layer formed on a surface of said semiconductor layer and
a support layer on a surface of said rear surface electrode layer at a side opposite the side where said semiconductor layer is formed, wherein
said semiconductor layer includes at least one p-n junction,
a plurality of through holes are provided, the through holes being cavities connecting support layer openings with semiconductor layer openings said support layer openings being provided on a surface of said support layer at a side opposite the side where said rear surface electrode layer is formed, said semiconductor layer openings being provided on a surface of said semiconductor layer at a side opposite the side where said rear surface electrode layer is formed,
said front surface electrode layer is formed in a region where said semiconductor layer openings are not pro- vided, and said front surface electrode layer is not formed in a region where said semiconductor layer openings are provided, and no electrode is formed on each of said support layer openings.

2. The solar cell according to claim 1, wherein said through holes have inner wall surfaces covered with said support layer.

3. The solar cell according to claim 1, wherein said semiconductor layer openings have a maximum diameter of 15 μm or less.

4. The solar cell according to claim 1, wherein adjacent ones of said semiconductor layer openings are spaced at a minimum distance of 200 μm or less.

5. The solar cell according to claim 1, wherein said semiconductor layer has a thickness of 20 μm or less.

6. The solar cell according to claim 1, wherein said semiconductor layer includes at least one of a GaAs-based compound semiconductor layer and a GaP-based compound semiconductor layer.

7. The solar cell according to claim 1, wherein the total opening area of said semiconductor layer openings is not more than 1% of the light receiving area in the surface of said semiconductor layer on which surface said semiconductor layer openings are provided.

8. The solar cell according to claim 1, wherein said support layer comprises an organic compound.

9. The solar cell according to claim 8, wherein said organic compound is polyimide.

10. A method of manufacturing a solar cell as recited in claim 1, comprising:

forming an etching layer on a semiconductor substrate forming said semiconductor layer on said etching layer forming, on said semiconductor layer said rear surface electrode layer having first etching holes penetrating said rear surface electrode layer along a thickness thereof;

forming, on said rear surface electrode layer said support layer having second etching holes penetrating said support layer along a thickness thereof to communicate with said first etching holes forming said through holes by performing etching on said semiconductor layer from said first etching holes and said second etching holes to expose said etching layer at a surface thereof;

separating said semiconductor layer from said semiconductor substrate by performing etching on said etching layer from at least said through holes and forming said front surface electrode layer on a surface of said semiconductor layer in a region where said semiconductor layer openings are not provided.

11. The method of manufacturing a solar cell according to claim 10, wherein said semiconductor substrate includes at least one selected from the group consisting of an Si, Ge, GaAs-based compound semiconductor, and a GaP-based compound semiconductor.

12. The method of manufacturing a solar cell according to claim 10, wherein said etching layer includes at least one of an AlAs-based compound semiconductor layer and a GaInP-based compound semiconductor layer.

13. The method of manufacturing a solar cell according to claim 10, wherein said first etching holes are formed by using at least one method selected from the group consisting of liftoff method using photolithography technique, etching, and laser beam irradiation.

14. The method of manufacturing a solar cell according to claim 10, wherein said second etching holes are formed by using at least one method selected from the group consisting of a method using photolithography technique, etching, and laser beam irradiation.

15. A method of manufacturing a solar cell as recited in claim 1, comprising:

forming an etching layer on a semiconductor substrate forming said semiconductor layer on said etching layer forming, on said semiconductor layer said rear surface electrode layer having first etching holes penetrating said rear surface electrode layer along a thickness thereof;

performing etching on said semiconductor layer from said first etching holes to form third etching holes that penetrate said semiconductor layer along a thickness thereof from said semiconductor layer openings to communicate with said first etching holes and exposing said etching layer at a surface thereof;

forming, on said rear surface electrode layer said support layer having second etching holes that penetrate said support layer along a thickness thereof to communicate with said first etching holes performing etching on said etching layer at least from said through holes to separate said semiconductor layer from said semiconductor substrate and forming said front surface electrode layer on a surface of said semiconductor layer in a region where said semiconductor layer openings are not provided.

16. The method of manufacturing a solar cell according to claim 15, wherein said semiconductor substrate includes at least one selected from the group consisting of an Si, Ge, GaAs-based compound semiconductor, and a GaP-based compound semiconductor.

17. The method of manufacturing a solar cell according to claim 15, wherein said etching layer includes at least one of an AlAs-based compound semiconductor layer and a GaInP-based compound semiconductor layer.

18. The method of manufacturing a solar cell according to claim 15, wherein said first etching holes are formed by using at least one method selected from the group consisting of liftoff method using photolithography technique, etching, and laser beam irradiation.

19. The method of manufacturing a solar cell according to claim 15, wherein said second etching holes are formed by using at least one method selected from the group consisting of a method using photolithography technique, etching, and laser beam irradiation.

20. The solar cell according to claim 1, wherein said semiconductor layer includes:

a first cell having a first band gap;

a second cell having a second band gap smaller than said first band gap; and a tunnel junction between said first cell and said second cell.

21. The solar cell according to claim 1, wherein said semiconductor layer includes:

a first cell having a first band gap;

a second cell having a second band gap smaller than said first band gap;

a third cell having a third band gap smaller than said second band gap;
a first tunnel junction between said first cell and said second cell; and
a second tunnel junction between said second cell and said third cell.

22. A method of manufacturing a solar cell as recited in claim 20, comprising:
forming an etching layer on a semiconductor substrate
forming said semiconductor layer on said etching layer
forming, on said semiconductor layer said rear surface electrode layer having first etching holes penetrating said rear surface electrode layer along a thickness thereof;
forming, on said rear surface electrode layer said support layer having second etching holes penetrating said support layer along a thickness thereof to communicate with said first etching holes
forming said through holes by performing etching on said semiconductor layer from said first etching holes and said second etching holes to expose said etching layer at a surface thereof;
performing etching on said etching layer at least from said through holes to separate said semiconductor layer from said semiconductor substrate and
forming said front surface electrode layer on a surface of said semiconductor layer in a region where said semiconductor layer openings are not provided.

23. A method of manufacturing a solar cell as recited in claim 21, comprising:
forming an etching layer on a semiconductor substrate
forming said semiconductor layer on said etching layer
forming, on said semiconductor layer said rear surface electrode layer having first etching holes penetrating said rear surface electrode layer along a thickness thereof;
forming, on said rear surface electrode layer said support layer having second etching holes penetrating said support layer along a thickness thereof to communicate with said first etching hole
forming said through holes by performing etching on said semiconductor layer from said first etching holes and said second etching holes to expose said etching layer at a surface thereof;
performing etching on said etching layer at least from said through holes to separate said semiconductor layer from said semiconductor substrate and
forming said front surface electrode layer on a surface of said semiconductor layer in a region where said semiconductor layer openings are not provided.

24. The solar cell according to claim 1, wherein said front surface electrode layer is not formed on a surface region of said semiconductor layer adjacent to said semiconductor layer openings.

25. The solar cell according to claim 1, wherein said region in which the front surface electrode is formed does not overlap any portion of the semiconductor openings.

* * * * *